United States Patent
Takamatsu

(10) Patent No.: US 6,197,366 B1
(45) Date of Patent: Mar. 6, 2001

(54) METAL PASTE AND PRODUCTION PROCESS OF METAL FILM

(75) Inventor: Hideki Takamatsu, Nishinomiya (JP)

(73) Assignee: Takamatsu Research Laboratory, Hyogo (JP)

( * ) Notice: Subject to any disclaimer, the term of this patent is extended or adjusted under 35 U.S.C. 154(b) by 0 days.

(21) Appl. No.: 09/423,476

(22) PCT Filed: May 6, 1997

(86) PCT No.: PCT/JP97/01527

§ 371 Date: Nov. 5, 1999

§ 102(e) Date: Nov. 5, 1999

(87) PCT Pub. No.: WO98/50601

PCT Pub. Date: Nov. 12, 1998

(51) Int. Cl.$^7$ ............... B05D 3/02; B05D 5/12; C09D 5/00

(52) U.S. Cl. ............... 427/125; 427/123; 427/376.7; 427/383.1; 106/1.23; 106/1.25; 106/1.26; 106/1.27; 106/1.28; 106/1.29

(58) Field of Search ............... 427/123, 125, 427/383.1, 376.7; 106/1.05, 1.23, 1.25, 1.26, 1.27, 1.28, 1.29

(56) References Cited

U.S. PATENT DOCUMENTS 3,904,783 * 9/1975 Nara et al. ............... 427/98
4,960,466 * 10/1990 Koplick ............... 106/1.29
5,423,927 * 6/1995 Laurent et al. ............... 156/64

FOREIGN PATENT DOCUMENTS

| 62-199669 | * | 9/1987 | (JP). |
| 63-293178 | * | 11/1988 | (JP). |
| 1-226721 | * | 9/1989 | (JP). |
| 1-318044 | * | 12/1989 | (JP). |
| 8-77826 | * | 3/1996 | (JP). |

* cited by examiner

*Primary Examiner*—Shrive Beck
*Assistant Examiner*—Michael Barr
(74) *Attorney, Agent, or Firm*—David G. Conlin; Lisa Swiszcz Hazzard; Dike, Bronstein, Roberts & Cushman, LLP

(57) ABSTRACT

According to the present invention, a metal paste comprising an organo- or inorganometallic compound of a metal that is a solid at ordinary temperature and belongs to group 3 through 15 of the periodic table, and an amino compound as medium, and which exhibits coatable viscosity, is provided. By using the metal paste, metal films of various types of metals or alloys can be formed inexpensively with an industrially simple process and apparatus even on various types of general-purpose, inexpensive substrates having a low softening point such as a glass, plastic, film and so forth, in addition to a ceramic substrate. In particular, the metal film can be formed easily in an ordinary pressure onto a printed wiring board or a substrate to be coated with a metal, which has a poor heat resistance.

15 Claims, 1 Drawing Sheet

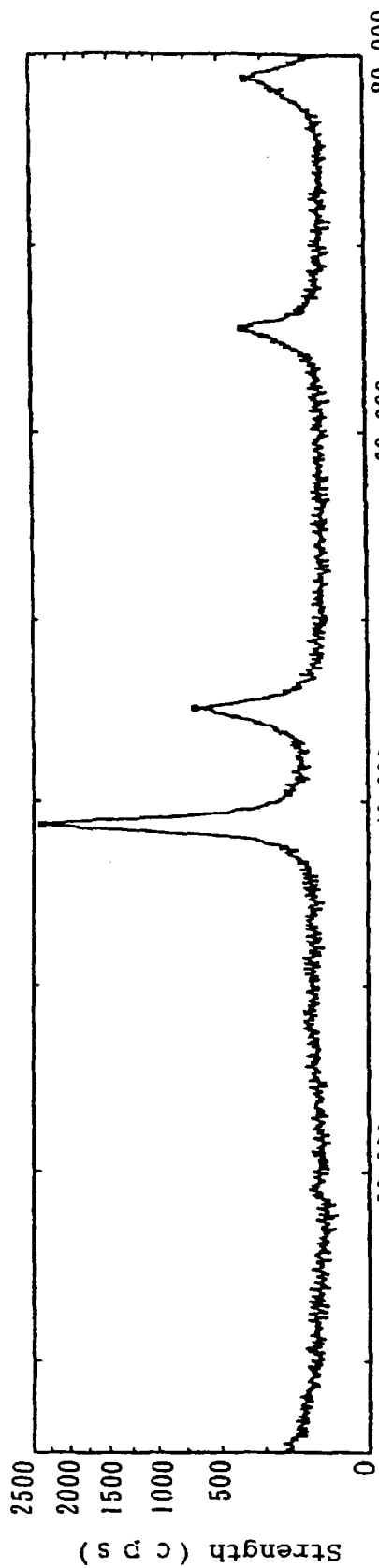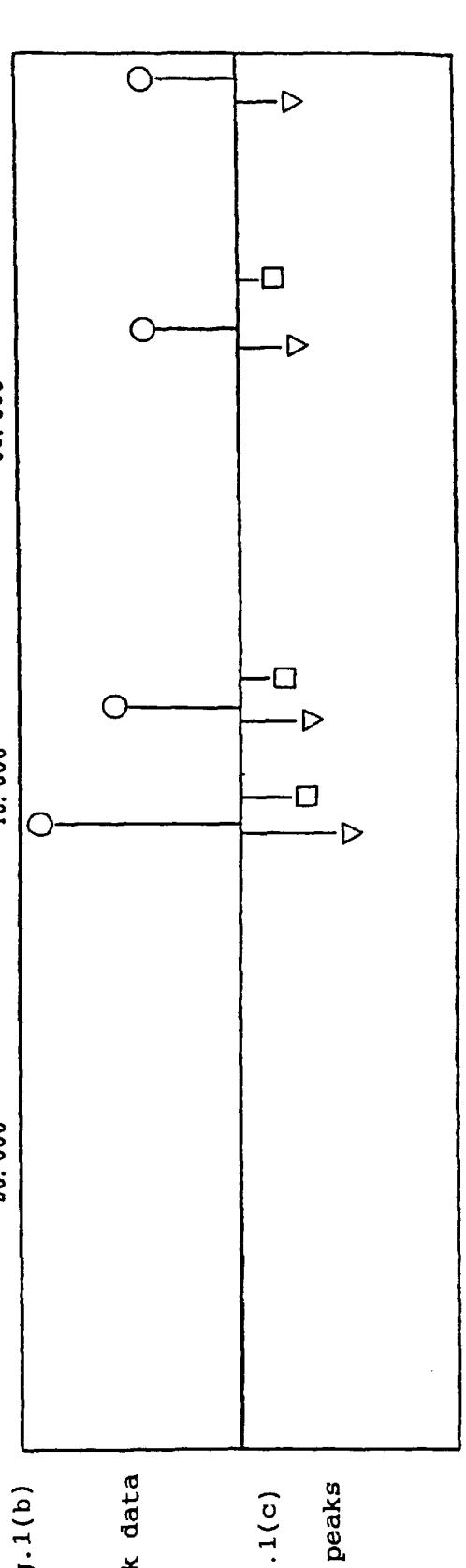
Fig.1(a), Fig.1(b), Fig.1(c)
□-Pd ▽-Ag ○-AgPd(80:20)

METAL PASTE AND PRODUCTION PROCESS OF METAL FILM

TECHNICAL FIELD

The present invention relates to a metal paste and a production process of a metal film. More particularly, the present invention relates to a metal paste that is able to form a metal film by low-temperature baking, and a production process of a metal film that uses said paste. The metal paste of the present invention is useful as the raw material of a metal film used for the surface treatment, coating, demagnetizing and decoration of electronic materials, electronic devices and mechanical materials, etc., and in catalysis and sterilization. Moreover, it is also useful as the raw material of a metal film used in the fields of pharmaceuticals and agricultural chemicals, etc.

In addition, if there was a process for easily producing a desired metal film even when metals are used directly as the base metal at present, there are many cases in which their use after forming into a metal film would be easier to handle and more economical. However, since baking at high temperatures is required to form a metal film, the substrate is limited to materials having a high melting point. Therefore, if the baking temperature for forming a metal film can be made lower, applications could be expanded to include general-purpose, inexpensive substrates having a low softening point (such as glass or plastic etc.). The present invention relates to a metal paste for low-temperature baking that allows this wide range of applications.

BACKGROUND ART

Metals have useful properties that are unique to each type of metal. Each of these types of metals are used either alone or in the form of an alloy for surface treatment, coating, demagnetizing and decorating of electronic materials, electronic devices, mechanical materials and so forth, as well as catalysis, sterilization, and even in the fields of pharmaceuticals and agricultural chemicals etc. by utilizing their respective characteristic performance (such as electrical conductivity, resistance, semi-conductivity, transparency, ionicity, corrosion resistivity, friction, light blocking, coloring and/or metallic luster) after forming into a film by various means on a substrate such as ceramics and so forth.

The following lists examples of technologies of the prior art used to produce metal films: (1) methods that require a high vacuum such as sputtering; and, (2) methods in which metallic ink is applied and baked such as the thick film paste method. The sputtering method of (1) requires an expensive, high-vacuum and large apparatus, has poor mass-productivity due to batch production, and has high production costs. Consequently, the paste method of (2) is used because of its low equipment cost and high productivity. In this method, various types of metal paste are coated onto a substrate and baked, allowing metal films to be produced continuously and inexpensively using a simple process and apparatus.

The paste used in this thick film paste method is a heterogeneous viscous liquid simply comprising forming various types of metal into fine particles and dispersing in a solvent. Coating and baking this viscous liquid results in a metal film in which the metal particles simply make contact, thereby preventing the formation of a uniform film. Consequently, in the case of silver-palladium alloy that is most frequently used in the electronics industry, even if formed with the thick film paste method, it is necessary to bake by heating to a high temperature of about 950° C. and physically melt the metal particles to obtain a uniform thin film. Consequently, only ceramic substrates, metal substrates or other substrates having a high melting point could be used for the substrate on which the metal film is formed. In addition, a large baking oven and peripheral facilities able to withstand high temperatures, and an energy source and so forth for high-temperature baking are required to perform baking at high temperatures.

Consequently, if the paste baking temperature could be lowered further, equipment costs could be reduced, energy could be saved, and costs could be lowered. In addition, since it desirable to form a metal film on a general-purpose, inexpensive substrate having a low softening point (such as glass or plastic etc.), it is preferable to further lower the baking temperature at which metal film is formed to allow use of those substrates.

In order to overcome this shortcoming, a method has been proposed (organometallic (MO) method) in which inorganic metal particles are first converted to an organometallic compound, coated after uniformly dissolving in a solvent, and then baked to obtain a thin, uniform metal film. For example, in the case of gold, a paste method using an organometallic compound containing sulfur allows the formation of a uniform gold film demonstrating equal performance while requiring approximately only $\frac{1}{7}$ the amount of gold as compared with the thick film paste method in which fine particles of gold are kneaded into a paste. Consequently, in fields that use gold, production is switching over to the MO method from the conventional thick film paste method.

A synthesis method in which an organic substance is bonded directly to a metal to transform into an organometallic compound is typically used as a method for producing the above-mentioned organometallic compound. In this synthesis method, a special production method is required to convert inorganic metal into an organometallic compound. In addition, since it is difficult to convert at a yield of 100% at that time, this method is more expensive than methods using metal and solvent. Thus, although this method can be used practically in the case the base metal itself is an expensive metal like gold, in the case of other metals, the use of this method results in the cost required for the process of converting to an organometallic compound being higher than the price of the metal itself. Consequently, there is a need in industry for a metal paste that allows metal films to be produced both inexpensively and easily.

DISCLOSURE OF THE INVENTION

In consideration of the above-mentioned problems, the inventors of the present invention found that when a general-purpose, inexpensive solid organo- or inorganometallic compound, and not a special, expensive organometallic compound, is mixed with a general-purpose, inexpensive amino compound, it unexpectedly changes into a liquid or mud to allow the obtaining of a coatable, viscous metal paste, thereby leading to completion of the present invention.

A production process in which an organo- or inorganometallic compound can be directly formed into a paste in the form of a metalloorganic (MO) ink by adding an amino compound to a solid organo- or inorganometallic compound followed by a simple means of manipulation in the form of stirring is not known in the literature.

According to the present invention, a metal paste is provided which demonstrates coatable viscosity and is composed of an organo- or inorganometallic compound of a metal that is a solid at normal temperature and belongs to groups 3 through 15 of the periodic table, and an amino compound as medium.

Although organometallic compounds are typically unstable, the compound is stabilized by the addition of organic acid and organic alcohol to the above-mentioned metal paste, thereby providing a metal paste which is characterized by improving solubility and printability.

Moreover, according to the present invention, a production process of a metal film is provided characterized in that the above-mentioned metal paste is coated onto a substrate and baked at a low temperature of 90° C.–550° C. to form a metal film.

BRIEF DESCRIPTION OF THE DRAWINGS

FIG. 1(a) indicates an X-ray diffraction pattern, FIG. 1(b) indicates the peak data of FIG. 1(a), and FIG. 1(c) indicates the peak data of silver and palladium only.

BEST MODE FOR CARRYING OUT THE INVENTION

In the present invention, a metal compound belonging to group 3 through 15 of the periodic table that is a solid at normal temperature includes that presented in the form of a complex of a metal and carbonyl compound, an organometallic compound such as an organic acid metal salt, a metal cyanide and an inorganometallic compound such as nitric acid metal salt.

Specific examples of a metal belonging to groups 3 through 15 of the periodic table include palladium, platinum, rhodium, gold, silver, cobalt, lead, copper, indium, tin, antimony, ruthenium, cadmium, thallium, bismuth, chromium, manganese, iron, nickel, zinc, molybdenum and so forth.

Specific examples of nitric acid metal salts include palladium nitrate, rhodium nitrate, silver nitrate, cobalt nitrate, lead nitrate, copper nitrate, indium nitrate, tin nitrate, ruthenium nitrate, cadmium nitrate, thallium nitrate, bismuth nitrate, chromium nitrate, manganese nitrate, iron nitrate, nickel nitrate, zinc nitrate and so forth.

Specific examples of metal cyanides include palladium cyanide, platinum cyanide, rhodium cyanide, gold cyanide, silver cyanide, cobalt cyanide, lead cyanide, copper cyanide, thallium cyanide, iron cyanide, nickel cyanide, zinc cyanide and so forth.

Carbonyl compounds include those which are able to form complexes with metal, examples of which include complexes with acetylacetone, acetoacetic ester, acetopropionic ester and so forth. Specific examples of complexes of metals and carbonyl compounds include complexes of metals and acetylacetone compounds such as acetylacetone platinum, acetylacetone rhodium, acetylacetone silver, acetylacetone cobalt, acetylacetone lead, acetylacetone copper, acetylacetone indium, acetylacetone cadmium, acetylacetone thallium, acetylacetone chromium, acetylacetone manganese, acetylacetone iron, acetylacetone nickel, acetylacetone zinc, acetylacetone molybdenum and so forth, complexes of metals and acetoacetic ester compounds such as ethyl acetoacetate zinc and so forth, complexes of metals and acetopropionic ester compounds such as ethyl acetopropionate zinc, and complexes of metals and carbonyl compounds such as rhodium carbonyl and ruthenium carbonyl and so forth.

In addition, examples of organic acid metal salts include formic acid metal salts, acetic acid metal salts, oxalic acid metal salts and cyclohexane propionic acid metal salts.

Specific examples of organic acid metal salts include formic acid metal salts such as palladium formate, indium formate, tin formate, antimony formate, silver formate, ruthenium formate and so forth, acetic acid metal salts such as palladium acetate, rhodium acetate, silver acetate, cobalt acetate, lead acetate, copper acetate, indium acetate, tin acetate, antimony acetate, ruthenium acetate, cadmium acetate, thallium acetate, bismuth acetate, chromium acetate, manganese acetate, iron acetate, nickel acetate, zinc acetate, molybdenum acetate and so forth, oxalic acid metal salts such as palladium oxalate, rhodium oxalate, silver oxalate, cobalt oxalate, lead oxalate, copper oxalate, indium oxalate, tin oxalate, antimony oxalate, ruthenium oxalate, cadmium oxalate, thallium oxalate, bismuth oxalate, chromium oxalate, manganese oxalate, iron oxalate, nickel oxalate, zinc oxalate, molybdenum oxalate and so forth, ruthenium cyclohexane propionate, palladium benzoate, silver benzoate and so forth.

The above-mentioned organo- or inorganometallic compound may be only one type or a combination of a plurality of types. In addition, the above-mentioned organo- or inorganometallic compounds may be in the form of hydrates.

Moreover, as the organo- or inorganometallic compounds, rhodium acetylacetonate, gold cyanide, palladium acetate, thallium acetate, silver acetate, bismuth acetate, tin acetate, cobalt acetate, indium acetate, copper acetate, antimony acetate, silver formate, palladium formate, indium formate, tin formate, copper formate, ruthenium cyclohexane propionate and tin oxalate are preferable.

Amino compounds that can be used in the present invention include those which allow organo- or inorganometallic compounds to be formed into a paste exhibiting coatable viscosity. Although liquid amino compounds are ordinarily used in the present invention, solids may also be used provided they can ultimately be formed into a paste. More specifically, the amino acid compounds of the present invention refer to compounds that form coordinate bonds with organo- or inorganometallic compounds, and the products of which exhibit the properties of a paste. As a result of their reaction, the organo- or inorganometallic compound exhibits a compatible state with the amino compound, and this is believed to result in the formation of a paste with suitable viscosity. Thus, amino compounds can be used even if they are a solid at ordinary temperature.

Preferable amino compounds are selected from the group represented with the following general formulas [A] and [B]:

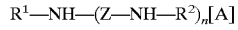

$R^1$—NH—(Z—NH—$R^2$)$_n$[A]

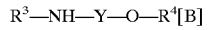

$R^3$—NH—Y—O—$R^4$[B]

(wherein, $R^1$, $R^2$, $R^3$ and $R^4$ are hydrogen atoms, linear hydrocarbons having 1–8 carbon atoms or cyclic hydrocarbons having 3–8 carbon atoms (which may be substituted with lower alkylene groups), Z and Y are linear hydrocarbons having 1–12 carbon atoms or cyclic hydrocarbons having 3–12 carbon atoms (which may be substituted with lower alkylene groups), and n is 0–4).

More specifically, examples of compounds represented with general formula [A] include diamino compounds such as 1,3-diaminopropane, N-methyl-1,3-diaminopropane,2,2-dimethyl-1,3-diaminopropane, 1,4-diaminobutane, 1,5-diaminopentane, 1,6-diaminohexane, 1,2-diaminocyclohexane, 1,3-diaminocyclohexane, 1,4-diaminocyclohexane, 1,7-diaminoheptane, 1,12-diaminododecane, 2-methyl-1,5-diaminopentane, 1,2- phenylenediamine and 1,3-phenylenediamine, 1,4-phenylenediamine and so forth, and monoamino compounds such as N-methylaniline and 1-phenylethylamine. Examples of compounds represented with general formula [B] include monoamino compounds such as 2-methoxyethylamine, 3-methoxypropylamine, 2-ethoxyethylamine, 3-ethoxypropylamine, 3-propoxypropylamine, 2-amino-1-propanol, 2-amino-2-methyl-1-propanol, 1-amino-2-propanol and so forth. Moreover, morpholine and so forth can also be used in addition to these amino compounds.

The above-mentioned amino compounds may be used alone or in combination of a plurality of types.

Here, monoamino compounds typically are inferior to diamino compounds in terms of the stability of the metal paste formed. However, even in the case of monoamino compounds, the following compounds:

$NH_2-(CH_2)_n-OH$;

or

$NH_2-(CH_2)_n-OR$ (wherein, R is a linear hydrocarbon having 1–8 carbon atoms or a cyclic hydrocarbon having 3–8 carbon atoms (which may be substituted with lower alkylene groups), and n is 1–12) and their derivatives are not inferior to diamino compounds, have various organo- or inorganometallic compounds dissolved highly, and have been found to have extremely good stability.

For example, when gold cyanide is dissolved in ethylenediamine to form a gold paste and then stored at room temperature, it decomposes in about 1 day. However, when an amine larger than 1,3-diaminopropane is used under the same conditions, the paste can be stored for a period from several weeks to several months. It was found there is a difference in stability due to their structures between compounds in which n=2 and n=3 or more. In other words, the stability of the metal paste was determined to differ greatly according to the type of metal and type of amine. Moreover, since amines in which n is 3 or more in the diamino compound $NH_2-(CH_2)_n-NH_2$ have excellent solubility and remarkable stability, and are able to provide a metal paste that can be baked at low temperatures, they are preferable.

The metal paste of the present invention is composed of a mixture of the above-mentioned organo- or inorganometallic compounds and amino compounds, and said mixture has a coatable viscosity. The present invention can be adjusted to the desired viscosity by changing the mixed amounts of the organo- or inorganometallic compound and amino compound. Here, it is preferable that the amino compound be contained at 0.2 moles or more, preferably at 0.6–17.51 moles, and particularly preferable at 1.0–3 moles relative to 1 mole of organo- or inorganometallic compound. Furthermore, if the amount of amino compound is less than 0.2 moles, it typically becomes difficult to obtain a viscosity that allows coating, which in addition to causing poor printability, makes it difficult to dissolve the organo- or inorganometallic compound, thereby making this undesirable.

If the molecular weight of the organic group contained in the metal paste becomes large, a high temperature is required to form the metal film by baking. Thus, in order to lower the baking temperature, the organic group should have a low molecular weight. However, if the molecular weight is excessively low, fluidity decreases which typically results in poor printability and a poor formed film. Therefore, when organic acid and/or alcohol and so forth are added to the metal paste and made an addition to a metal, printability and film formability can be improved while holding down the baking temperature.

In particular, organic acids that can be added to the metal paste of the present invention are able to improve the stability and solubility of the metal paste by their addition even in the case of unstable organo- or inorganometallic compounds, change the baking temperature and decomposition temperature, and improve film formability by making the baked film homogeneous. In addition, by changing the type of organic acid according to the respective purpose or application, the baking temperature can be adjusted to form metal films having various performance.

Here, it is preferable to use an aliphatic or aromatic mono- or dicarboxylic acid represented with the following general formula [C]:

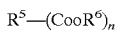

$R^5-(CooR^6)_n$      [C]

(wherein, $R^5$ and $R^6$ are hydrogen atoms, linear hydrocarbons having 1–20 carbon atoms or cyclic hydrocarbons having 3–20 carbon atoms, both of which may be substituted with alkylene groups, and n is 1–3 (provided that n is 1 when $R^5$ is a hydrogen atom)). In addition, the aliphatic or aromatic mono- or dicarboxylic acid may be substituted with substituents such as a lower alkyl group and so forth. Specific examples of aliphatic or aromatic mono- or dicarboxylic acids include formic acid, oxalic acid, acetic acid, propionic acid, butylic acid, valeric acid, caproic acid, heptanoic acid, caprylic acid, 2-ethylhexanoic acid, cyclohexanoic acid, cyclohexanepropionic acid, cyclohexaneacetic acid, nonanoic acid, malic acid, glutamic acid, leucic acid, hydroxypivalinic acid, pivalinic acid, glutaric acid, adipic acid, cyclohexanedicarbonic acid, pimelic acid, cork acid, ethylbutylic acid, benzoic acid, phenylacetic acid, phenylpropionic acid, hydroxybenzoic acid and so forth.

Although varying according to the particular type used, the addition ratio of aliphatic or aromatic mono- or dicarboxylic acid is preferably 0–5 moles to 1 mole of organo- or inorganometallic compound.

On the other hand, the addition of aliphatic or aromatic mono- or polyhydric alcohol is able to improve the stability, solubility and printability of metal paste even in the case of unstable organo- or inorganometallic compounds.

Here, it is preferable to use an aliphatic or aromatic mono- or polyhydric alcohol represented with the following general formula [D]:

$R^6-(OH)_n$      [D]

(wherein, $R^6$ is a linear hydrocarbon having 1–20 carbon atoms or a cyclic hydrocarbon having 3–20 carbon atoms, both of which may be substituted with an alkylene group, and n is 1–4). Moreover, the aliphatic or aromatic mono- or polyhydric alcohol may have a substituent, and it is preferable to use an aliphatic or aromatic mono- or polyhydric alcohol substituted with a cyano group represented with the following general formula [E]:

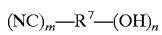

$(NC)_m-R^7-(OH)_n$      [E]

(wherein, $R^7$ is a linear hydrocarbon having 1–7 carbon atoms or a cyclic hydrocarbon having 3–8 carbon atoms, n is 1–3 and m is 1 or 2 (provided that n+m=1–4 when $R^7$ has 1 carbon atom, and n+m=1–6 when $R^7$ has 2 or more carbon atoms)).

Examples of aliphatic or aromatic mono- or polyhydric alcohols corresponding to general formula [D] include nerol, citronellol, hydroxynerol, hydroxycitronellol, ethyl alcohol, propyl alcohol, butyl alcohol, hexyl alcohol, ethylhexyl alcohol, decyl alcohol, benzyl alcohol, hydroxybenzyl alcohol, phenylethyl alcohol, phenylpropyl alcohol, dihydroxybenzene, cyclohexyl alcohol, ethylcyclohexyl alcohol, butylcyclohexyl alcohol, methoxybenzyl alcohol, piperonyl alcohol, ethylene glycol, propylene glycol, 1,2-butanediol,2,2-dimethyl-1,3-propanediol and so forth.

Moreover, esters of the aliphatic or aromatic mono- or polyhydric alcohols represented with general formula [D] and organic acids can also be used. Specific examples of these compounds include methyl benzoate, ethyl hydroxybenzoate, ethyl 2-ethylhexanoate, ethyl acetate, ethyl hydroxyacetate, methyl linolate and so forth.

Moreover, ether compounds of the aliphatic or aromatic mono- or polyhydric alcohols represented with general formula [D] can also be used. Specific examples of these compounds include ethylene glycol monomethyl ether, diethylene glycol monoethyl ether, triethylene glycol monopropyl ether, propylene glycol monomethyl ether, propylene glycol monoethyl ether, tripropylene glycol monopropyl ether, diethylene glycol, dipropylene glycol, ethylene glycol monobutyl ether, 1-butoxy-2-propanol and so forth.

Examples of aliphatic or aromatic mono- or polyhydric alcohols represented with general formula [E] include lactonitrile, hydroxyacetonitrile, ethylene cyanohydrin, acetone cyanohydrin and so forth.

It is particularly preferable to add one of the above-mentioned aliphatic or aromatic mono- or polyhydric alcohols having the cyano group of general formula [E]. The addition of this alcohol makes it possible to make unstable organo- or inorganometallic compounds extremely stable and maintain a stable, transparent paste state. Here, although it is difficult to maintain a paste using a monovalent gold compound in a stable state, addition of an alcohol having the above-mentioned cyano group of general formula [E] enables this compound to be stored at room temperature for roughly 4 years or more.

Although varying according to the type of alcohol added, the addition ratio of aliphatic or aromatic mono- or polyhydric alcohol is preferably 0–5 moles to 1 mole of organo- or inorganometallic compound.

Furthermore, both an aliphatic or aromatic mono- or dicarboxylic acid and aliphatic or aromatic mono- or polyhydric alcohol may be added to a metal paste.

Here, the printability of organometallic compounds is known to generally not be good in the case of coating by printing methods. In the present invention, however, it was found that the addition of organic ketone or organic ether to the above-mentioned metal paste changes it to a smooth paste rich in spreadability. As a result, printability can be improved. Since storage stability is also improved, it is possible to form a thin and uniform metal film.

Aliphatic or aromatic ketones can be used for the above-mentioned organic ketone. Specific examples of organic ketones include aliphatic ketones such as acetone, ethyl methyl ketone, 2-pentanone, 3-pentanone, 3-methyl-2-butanone, 2-hexanone, 3-hexanone, methyl butyl ketone, 3-methyl-2-pentanone, 2-heptanone, 3-heptanone, 4-heptanone, amyl methyl ketone, ethyl butyl ketone, 2,4-dimethyl-3-pentanone, 2-octanone, 3-octanone, 4-octanone, 2,5-dimethyl-3-hexanone, cyclohexanone, methylcyclohexanone, acetylacetone, 2,3-butanedione, 2,3-pentanedione, 3,4-hexanedione, 2,5-hexanedione, cyclohexanedione and so forth, and aromatic ketones such as acetophenone.

Aliphatic or aromatic ethers can be used for the above-mentioned organic ether. Specific examples of organic ethers include aliphatic ethers such as 4-methoxy-2-butanone, 4-ethoxy-2-butanone, 4-methoxy-2-butanone, 2methoxy-2-methyl-4-pentanone, ethylene glycol dimethyl ether, ethylene glycol diethyl ether, ethylene glycol dipropyl ether, propylene glycol dimethyl ether, propylene glycol diethyl ether, diethylene glycol dimethyl ether, diethylene glycol diethyl ether, dipropylene glycol dimethyl ether, dipropylene glycol diethyl ether, propylene glycol propyl ether, acetal, acetone diethylacetal,2,2dimethoxypropane and so forth, and aromatic ethers such as anisol, dimethoxybenzene and so forth.

Although varying according to the type of compound, the addition ratio of aliphatic or aromatic ketone or ether is preferably 0–4 moles per 1 moles of organo- or inorganometallic compounds.

Furthermore, aliphatic or aromatic ketone or ether may be added in combination to a metal paste.

The reason for obtaining a stable metal paste in the present invention is believed to be due to the following action. Namely, when an amino compound is added to a solid organo- or inorganometallic compound at ordinary temperature and stirred, the organo- or inorganometallic compound coordinates with the amino compound that has become a liquid resulting in the formation of a paste.

Furthermore, although there are cases in which crystallization occurs as a result of mixing depending on the particular combination of organo- or inorganometallic compound and amino compound, a paste can be formed at that time if different types of amino compounds are used. In addition, although there are many cases in which the amino compound of an organo- or inorganometallic compound alone is unstable, since the addition of organic acid results in the composition of a structure in which positivity and negativity are interlaced throughout the composition, active metal entrapped within are thought to be stabilized.

According to the production process of a metal film of the present invention, a metal film can be produced by coating a metal paste onto a desired substrate and baking. During the baking at this time, alcohols having weak bonding strength at low temperatures are separated after which acids come off followed by amine coordination breaks down. As the temperature rises further, organic groups directly bonded to metal are severed resulting in the formation of a metal film. Since smaller organic groups decompose more at lower temperatures than larger organic groups at this time, a metal film is believed to be able to be produced at low temperatures. This is the mechanism of action responsible for forming a metal film as a result of making a solid organo- or inorganometallic compound form a paste and then making it decompose at ordinary temperature.

Furthermore, metals are already used in various fields as an important material. Namely, the above-mentioned metals are considered to be important materials in the fields of electronic materials, mechanical materials, optical materials, sanitary materials, domestic materials, agricultural materials, pharmaceutical materials and so forth. The paste of the present invention can be used as an electrically conductive material, resistor material, heat transmitting material, heat insulating material, light and electromagnetic wave reflecting and absorbing materials, corrosion resistant material, mechanically strong material, material for absorbing abrasion, material for cataryst, metal luster material, material for coloring, material for decoration or microbial growth-inhibiting material and so forth for which metals have conventionally been used by utilizing the various properties characteristic to metals in these fields.

The baking temperature is 90–550° C., and preferably 110–350° C. This temperature allows the heat treatment temperature to be lowered remarkably in comparison with methods of the prior art in which treatment is conventionally performed by heating to a temperature at or above the melting point of the metal. Consequently, the process of producing a metal film of the present invention can also be applied to a substrate on which a metal paste can be coated such as not only substrates having a high melting point that are able to withstand heating at high temperatures (such as ceramics and metal), but also other substrates such as general-purpose glass, resins (thermosetting resins and thermoplastic resins), paper and so forth. Accordingly, it becomes possible to provide a metal film coated substrate having properties characteristic to metals. Furthermore, low melting point substrates in the form of a film or sheet are also included in the substrates in the present invention.

EXAMPLES

The following provides a detailed explanation of examples of the present invention.

Example 1

When 0.70 g (9.45 mmol) of 1,3-diaminopropane ($NH_2CH_2CH_2CH_2NH_2$), 0.70 g (7.94 mmol) of N-methyl-1,3-diaminopropane ($CH_3NHCH_2CH_2CH_2NH_2$) and 0.40 g (4.49 mmol) of 3-methoxypropylamine ($CH_3OCH_2CH_2CH_2NH_2$) were added to 1.00 g (4.34 mmol) of palladium nitrate ($Pd(NO_3)_2$) and stirred, a paste was formed. When 1.20 g (13.62 mmol) of isobutyric acid (($CH_3)_2CHCOOH$) were added and kneaded, a dark brown, nearly transparent paste was formed. When this was coated on a substrate such as glass and so forth, heated to 320° C. and baked for 5 minutes, a palladium thin film was obtained. Furthermore, in this example, 5.04 moles of amino compounds were used to 1 mole of metal.

Example 2

When 0.60 g (8.10 mmol) of 1,3-diaminopropane, 0.20 g (2.27 mmol) of N-methyl-1,3-diaminopropane, 1.50 g (19.97 mmol) of 2-methoxyethylamine ($CH_3OCH_2CH_2NH_2$), and 0.40 g (5.63 mmol) of lactonitrile ($CH_3CH(OH)CN$) were added to 1.00 g (6.31 mmol) of palladium cyanide ($Pd(CN)_2$) and stirred, a transparent paste was formed. When this was coated onto a substrate such as glass and so forth, heated to 300° C. and baked for 10 minutes, a homogeneous palladium thin film was obtained. Furthermore, in this example, 4.81 moles of amino compounds were used to 1 mole of metal.

Example 3

When 0.60 g (6.80 mmol) of N-methyl-1,3-diaminopropane and 0.40 g (5.33 mmol) of 2-methoxyethylamine were added to 1.00 g (4.45 mmol) of palladium acetate ($Pd(OOCCH_3)_2$) and stirred, a transparent paste was formed. When this was coated onto a substrate such as glass and so forth, heated to 250° C. and baked for 10 minutes, a homogeneous palladium film was obtained. Furthermore, in this example, 2.73 moles of amino compounds were used to 1 mole of metal.

Example 4

When 0.60 g (5.60 mmol) of N-methylaniline ($C_6H_5NHCH_3$) and 0.30 g (3.41 mmol) of isobutylic acid were added to 1.00 g (4.45 mmol) of palladium acetate and dissolved, a brown transparent paste was formed. When phenylethyl alcohol was added and kneaded as necessary, a dark reddish-brown paste was formed having improved printability. When this was coated onto a substrate such as glass and so forth, heated to 250° C. and baked for 10 minutes, a specular palladium film was obtained. Furthermore, in this example, 1.26 moles of amino compounds were used to 1 mole of metal.

Example 5

When 0.20 g (1.05 mmol) of N,N-diethyl-triamide and 3.00 g (17.2 mmol) of hydroxycitronellol were added to 1.00 g (4.45 mmol) of palladium acetate ($Pd(OOCCH_3)_2$) and stirred, a translucent paste was formed. When this was coated onto a substrate such as glass and so forth, heated to 250° C. and baked for 10 minutes, a homogeneous palladium film was obtained. Furthermore, in this example, 0.24 moles of amino compound were used to 1 mole of metal.

Example 6

When 0.20 g (2.32 mmol) of methacrylic acid and 0.35 g (4.66 mmol) of 2-methoxyethylamine were added to 1.00 g (4.45 mmol) of palladium acetate and stirred, dark colored paste was formed. When this was coated onto a substrate such as glass and so forth, heated to 230° C. and baked for 10 minutes, a homogeneous palladium film was obtained. Furthermore, in this example, 1.05 moles of amino compound were used to 1 mole of metal.

Example 7

When 0.40 g (3.73 mmol) of 1-phenylethylamine ($C_6H_5CH(CH_3)NH_2$) and 0.40 g (3.92 mmol) of valeric acid were added to 1.00 g (4.45 mmol) of palladium acetate and stirred, this was kneaded until a dark brown paste formed. When this was coated onto a substrate such as glass and so forth, heated to 250° C. and baked for 10 minutes, a homogeneous palladium film was obtained. Furthermore, in this example, 0.84 moles of amino compound were used to 1 mole of metal.

Example 8

When 1.00 g (8.76 mmol) of 1,2-diaminocyclohexane ($C_6H_{10}(NH_2)_2$) was added to 1.00 g (3.02 mmol) of platinum nitrate diaminopropane coordination compound ($NH_2CH_2CH_2CH_2NH_2$ $Pt(NO_3)_2$) and kneaded, a light brown paste was formed. When a nearly equal amount of acetic acid was added and kneaded, a nearly transparent, light brown paste was formed. When both were coated onto a substrate such as glass and so forth, respectively, heated to 350° C. and baked for 5 minutes, platinum films were obtained. When a higher acid such as heptanoic acid and so forth is used at this time, adhesion was improved. Furthermore, in this example, 3.90 moles of amino compound were used to 1 mole of metal.

Example 9

0.60 g (5.25 mmol) of 1,2-diaminocyclohexane and 0.30 g (4.05 mmol) of 1,3-diaminopropane were added to 1.00 g (3.75 mmol) of thallous nitrate ($TlNO_3$) and stirred. A colorless, transparent paste was formed. When this was coated onto a substrate such as glass and so forth, heated to 170–180° C. and baked in a reducing atmosphere, a thallium film was obtained. Furthermore, in this example, 2.48 moles of amino compounds were used to 1 mole of metal.

Example 10

0.80 g (9.07 mmol) of N-methyl-1,3-diaminopropane were added to 1.00 g (2.50 mmol) of rhodium acetylacetonate (Rh(CH$_3$COCHCOCH$_3$)$_3$) to form a paste. When 0.60 g (6.81 mmol) of isobutylic acid were added and kneaded, a dark brown, transparent and homogeneous paste was formed. When this was coated onto a substrate such as glass and so forth, heated to 390° C. and baked for 5 minutes, a rhodium film was obtained. Furthermore, in this example, 3.63 moles of amino compound were used to 1 mole of metal.

Example 11

When 0.60 g (8.10 mmol) of 1,3-diaminopropane and 0.40 g (5.33 mmol) of 2-amino-1-propanol (NH$_2$CH(CH$_3$)CH$_2$OH) were added to 1.00 g (5.63 meq) of hexarhodium hexadecacarbonyl (Rh$_6$(CO)$_{16}$) and kneaded, a homogeneous paste was formed. When this was coated onto a substrate such as glass and so forth, heated to 290° C. and baked for 5 minutes, a rhodium film was obtained. Furthermore, in this example, 2.39 moles of amino compound were used to 1 mole of metal.

Example 12

0.40 g (4.54 mmol) of N-methyl-1,3-diaminopropane, 0.10 g (0.77 mmol) of 1,7-diaminoheptane (NH$_2$(CH$_2$)$_7$NH$_2$) and 0.10 g (1.12 mmol) of 3-propoxypropylamine were added to 1.00 g (4.48 mmol) of gold cyanide (AuCN) and stirred. When 0.70 g (5.46 mmol) of cyclohexanoic acid (C$_6$H$_{11}$COOH) and 0.80 g (5.55 mmol) of 2-ethylhexanoic acid (CH$_3$CH$_2$CH(CH$_3$CH$_2$)COOH) were added and kneaded, a reddish-violet transparent paste was formed. When this was coated onto a substrate such as glass and so forth and baked at 500–550° C., a gold mirror thin film was obtained. Furthermore, in this example, 1.44 moles of amino compounds were used to 1 mole of metal.

Example 13

0.80 g (11.25 mmol) of lactonitrile, 0.60 g (5.87 mmol) of 2,2-dimethyl-1,3-diaminopropane (NH$_2$CH$_2$C(CH$_3$)$_2$CH$_2$NH$_2$), 0.10 g (0.77 mmol) of 1,7-diaminoheptane and 0.30 g (3.37 mmol) of 3-methoxypropylamine were added to 1.00 g (4.48 mmol) of gold cyanide and stirred. A light orange, transparent paste was formed. When this was coated onto a substrate such as glass and so forth and baked at 500–550° C., a gold film was obtained. When lactonitrile was added at this time, the organometallic compound became extremely stable, and was confirmed to remain in the form of a light orange, transparent paste without demonstrating any decomposition whatsoever even after 4 years of storage at room temperature. Furthermore, in this example, 2.23 moles of amino compounds were used to 1 mole of metal.

Example 14

0.70 g (4.42 mmol) of nonanoic acid (C$_8$H$_{17}$COOH) were added to 1.00 g (5.99 mmol) of silver acetate (CH$_3$COOAg) and kneaded. When 0.60 g (8.10 mmol) of 1,3-diaminopropane were added to this and stirred, a whitish-gray paste was formed. This was further kneaded to form a brown, translucent paste. 0.04 g (0.37 mmol) of 1,4-phenylenediamine (C$_6$H$_4$(NH$_2$)$_2$) were added and kneaded until the paste became reddish-brown and translucent. 0.50 g (6.75 mmol) of propionic acid (CH$_3$CH$_2$COOH) were added and kneaded until a reddish-brown transparent paste was formed. When this was coated onto a substrate such as glass and so forth, heated to 350° C. and baked for 5 minutes, a silver mirror silver film was obtained. Furthermore, in this example, 1.41 moles of amino compounds were used to 1 mole of metal.

Example 15

0.80 g (8.98 mmol) of 3-methoxypropylamine and 0.05 g (0.25 mmol) of 1,12-diaminododecane (NH$_2$(CH$_2$)$_{12}$NH$_2$) were added to 1.00 g (5.99 mmol) of silver acetate and stirred. 1.00 g (7.68 mmol) of heptanoic acid (C$_6$H$_{13}$COOH) and 0.15 g (1.12 mmol) of malic acid (HOOCCH$_2$CH(OH)COOH) were then added and stirred. Moreover, when 0.60 g (8.10 mmol) of 1,3-diaminopropane were added and kneaded until the color changed to a pale brick color, a transparent paste formed. When this was coated onto a substrate such as glass and so forth, heated to 300° C. and baked for 10 minutes, a silver-colored film was obtained. Furthermore, in this example, 2.89 moles of amino compounds were used to 1 mole of metal.

Example 16

0.50 g (6.75 mmol) of 1,3-diaminopropane, 0.60 g (6.73 mmol) of 3-methoxypropylamine and 0.05 g (0.24 mmol) of 1,12-diaminododecane were added to 1.00 g (5.99 mmol) of silver acetate and stirred. When 0.80 g (6.14 mmol) of heptanoic acid, 0.40 g (2.56 mmol) of cyclohexanepropionic acid (C$_6$H$_{11}$(CH$_2$)$_2$C0OH), 0.15 g (1.12 mmol) of malic acid and 0.2 g (1.75 mmol) of 1,2-diaminocyclohexane were added and kneaded until the color changed to a dark reddish-orange color, a transparent paste was formed. When this was coated onto a substrate such as glass and so forth, heated to 230° C. and baked for 10 minutes, a silver mirror film was obtained. Alternatively, when heated to 290° C. and baked for 10 minutes, a silver-colored film was obtained. Furthermore, in this example, 1.46 moles of amino compounds were used to 1 mole of metal.

Example 17

0.50 g (6.75 mmol) of 1,3-diaminopropane and 0.40 g (2.53 mmol) of nonanoic acid were added to 1.00 g (5.99 mmol) of silver acetate and kneaded to form a reddish-orange transparent paste. 0.10 g (0.88 mmol) of 1,2-diaminocyclohexane were added and kneaded. On the following day, a purple paste was formed. When this was coated onto a substrate such as glass and so forth, heated to 300° C. and baked for 5 minutes, a silver mirror film was obtained. Furthermore, in this example, 1.27 moles of amino compounds were used to 1 mole of metal.

Example 18

0.80 g (7.01 mmol) of 1,2-diaminocyclohexane were added to 1.00 g (6.54 mmol) of silver formate (HCOOAg) and kneaded. 0.50 g (6.58 mmol) of ethylene glycol monomethyl ether (CH$_3$OCH$_2$CH$_2$OH) were added to form a blackish-gray transparent paste. When this was coated onto a substrate such as a film and so forth, heated to 130° C. and baked for 5 minutes, a slightly yellow-tinted silver film was obtained. Furthermore, in this example, 1.07 moles of amino compound were used to 1 mole of metal.

Example 19

0.80 g (10.80 mmol) of 1,3-diaminopropane were added to 1.00 g (6.54 mmol) of silver formate and kneaded. When this was coated onto a substrate such as a film and so forth, heated to 110° C. and baked for 5 minutes, a silver film was obtained. When 0.60 g (9.98 mmol) of acetic acid (CH$_3$COOH) were added and kneaded, a stable paste was formed. When this was coated onto a substrate such as a film and so forth, heated to 120° C. and baked for 5 minutes, a gray silver film was obtained. Furthermore, in this example, 1.65 moles of amino compound were used to 1 mole of metal.

Example 20

0.273 g (1.22 mmol) of palladium acetate powder were added to 0.80 g (4.79 mmol) of silver acetate crystals and mixed, after which 0.30 g (2.58 mmol) of 2-methyl-1,5-diaminopentane ($NH_2(CH_2)_3CH(CH_3)CH_2NH_2$), 0.30 g (2.48 mmol) of 1-phenylethylamine ($C_6H_5CH(NH_2)CH_3$) and 0.30 g (3.44 mmol) of morpholine (O<$(CH_2)_4$>NH) were added and stirred. When 0.30 g (2.30 mmol) of heptanoic acid were added and kneaded, a brown transparent paste was formed. When this was coated onto a substrate such as glass and so forth, heated to 320° C. and baked for 10 minutes, a mirrored silver-palladium alloy film was obtained. Furthermore, in this example, 1.41 moles of amino compounds were used to 1 mole of metal.

Example 21

1.20 g (10.51 mmol) of 1,2-diaminocyclohexane and 0.60 g (6.73 mmol) of 3-methoxypropylamine were added to 1.00 g (2.59 mmol) of bismuth acetate ($Bi(OOCCH_3)_2$) and stirred. A light-coloredtransparent paste was formed. When this was coated onto a substrate such as glass and so forth, heated to 250–350° C. and baked in a reducing atmosphere, a bismuth film was obtained. Furthermore, in this example, 6.66 moles of amino compounds were used to 1 mole of metal.

Example 22

1.10 g (9.63 mmol) of 1,2-diaminocyclohexane were added to 1.00 g (2.64 mmol) of lead acetate trihydrate ($Pb(OOCCH_3)_2.3H_2O$) and stirred. 0.20 g (2.27 mmol) of isobutylic acid were further added and stirred. A light-colored, nearly transparent paste was formed. When this was coated onto a substrate such as glass and so forth, heated to 270–300° C. and baked in a reducing atmosphere, a lead film was obtained. Furthermore, in this example, 3.65 moles of amino compound were used to 1 mole of metal.

Example 23

0.80 g (9.07 mmol) of N-methyl-1,3-diaminopropane were added to 1.00 g (4.01 mmol) of cobalt acetate tetrahydrate ($Co(OOCCH_3)_2.4H_2O$) and stirred. A dark purple, transparent paste was formed. When this was coated onto a substrate such as glass and so forth, heated to 270–300° C. and baked in a reducing atmosphere, a cobalt film was obtained. Furthermore, in this example, 2.26 moles of amino compound were used to 1 mole of metal.

Example 24

0.90 g (12.15 mmol) of 1,3-diaminopropane were added to 1.00 g (3.42 mmol) of indium acetate ($In(OOCCH_3)_3$) and stirred. A slightly milky colorless and transparent paste was formed. When this was coated onto a substrate such as glass and so forth, heated to 220–230° C. and baked in a reducing atmosphere, an indium film was obtained. Furthermore, in this example, 3.55 moles of amino compound were used to 1 mole of metal.

Example 25

1.20 g (16.19 mmol) of 1,3-diaminopropane, 1.40 g (15.71 mmol) of 3-methoxypropylamine and 1.20 g (6.90 mmol) of hydroxycitronellol ($HOC(CH_3)_2CH_2CH_2CH_2CH(CH_3) CH_2CH_2OH$) were added to 1.00 g (5.51 mmol) of copper acetate ($Cu(OOCCH_3)_2$) and stirred. A blue transparent liquid was formed. When this was coated onto a substrate such as glass and so forth, heated to 350–360° C. and baked in a reducing atmosphere, a copper film was obtained. Furthermore, in this example, 5.79 moles of amino compounds were used to 1 mole of metal.

Example 26

0.60 g (6.80 mmol) of N-methyl-1,3-diaminopropane and 0.60 g (6.73 mmol) of 3-methoxypropylamine were added to 1.00 g (3.35 mmol) of antimony acetate ($Sb(OOCCH_3)_3$) and stirred. Moreover, when 0.40 g (3.92 mmol) of pivalinic acid ($CH_3C(CH_3)_2COOH$) were added and kneaded, a milk-colored translucent paste was formed. When this was coated onto a substrate such as glass and so forth, heated to 360° C. and baked in a reducing atmosphere, an antimony film was obtained. Furthermore, in this example, 4.04 moles of amino compounds were used to 1 mole of metal.

Example 27

When 1.10 g (14.65 mmol) of 2-amino-1-propanol ($NH_2CH(CH_3)CH_2OH$) were added to 1.00 g (3.75 mmol) of cadmium acetate dehydrate ($Cd(OOCCH_3)_2.2H_2O$) and stirred, a yellow transparent paste was formed. When this was treated at 200–240° C., coated onto a substrate such as glass and so forth, heated to 250° C. and baked in a reducing atmosphere, a cadmium film was obtained. Furthermore, in this example, 3.91 moles of amino compound were used to 1 mole of metal.

Example 28

2.00 g (17.51 mmol) of 1,2-diaminocyclohexane were added to 1.00 g (1.76 mmol) of ruthenium cyclohexanepropionate ($Ru(OOCCH_2CH_2C_6H_{11})_3$) and stirred. When this paste was coated onto a substrate such as glass and so forth, heated to 300° C. and baked in a reducing atmosphere, a ruthenium film was obtained. Furthermore, in this example, 9.95 moles of amino compound were used to 1 mole of metal.

Example 29

When 2.00 g (17.51 mmol) of 1,2-diaminocyclohexane and 0.90 g (12.15 mmol) of 1,3-diaminopropane were added to 1.00 g (4.84 mmol) of tin oxalate ($Sn(COO)_2$) and stirred, a cream-colored paste was formed. When 1.00 g (6.40 mmol) of cyclohexanepropionic acid were added to this paste and stirred, a translucent paste was formed. When this was coated onto a substrate such as glass and so forth, heated to 360–400° C. and baked in a reducing atmosphere, a tin film was obtained. Furthermore, in this example, 6.13 moles of amino compounds were used to 1 mole of metal.

Example 30

0.273 g (1.22 mmol) of palladium acetate powder were added to 0.80 g (4.79 mmol) of silver acetate crystals and mixed, after which 0.30 g (2.58 mmol) of 2-methyl-1,5-diaminopentane, 0.30 g (2.48 mmol) of 1-phenylethylamine and 0.30 g (3.44 mmol) of morpholine were added and stirred. Next, when 0.30 g (2.30 mmol) of heptanoic acid were added and kneaded, a brown, transparent paste was formed. When this was coated onto a substrate such as glass and so forth, heated to 290° C. and baked for 15 minutes, a mirrored metal film was obtained. When this was subjected to X-ray diffraction, there were no peaks observed at the location associated with silver alone or at the location associated with palladium alone as is clear from (a) through (c) in FIG. 1. Instead, a single peak appeared at a location intermediate to the locations associated with silver and palladium alone. Furthermore, FIG. 1(a) shows the X-ray diffraction pattern, FIG. 1(b) shows the peak data of FIG. 1(a), and FIG. 1(c) shows the peak data (card data) of silver and palladium alone. As a result, a silverpalladium alloy having a melting point of 290° C. considerably lower than the melting point of each metal was confirmed to have been formed. Furthermore, in this example, 1.41 moles of amino compounds were used to 1 mole of metal.

Example 31

When 0.70 g (7.94 mmol) of N-methyl-1,3-diaminopropane and 0.10 g (1.33 mmol) of 1-amino-2-propanol ($NH_2CH_2CH(CH_3)OH$) were added to 1.00 g (4.02 mmol) of nickel acetate tetrahydrate ($Ni(OOCCH_3)_2 \cdot 4H_2O$) and stirred, a blue, transparent viscous liquid was formed. When 0.40 g of methyl isobutyl ketone and 0.80 g of isobutylic acid were added to this liquid and stirred, a transparent paste was formed. When this was coated onto a substrate such as glass and so forth, heated to 300° C. in a reducing atmosphere and baked, a nickel film was obtained. Furthermore, in this example, 2.31 moles of amino compounds were used to 1 mole of metal.

Example 32

When 1.30 g (14.74 mmol) of N-methyl-1,3-diaminopropane and 0.55 g (7.32 mmol) of 1-amino-2-propanol were added to 1.00 g (2.34 mmol) of molybdenum acetate dimer crystals ($[(CH_3COO)_2Mo]_2$) and stirred, a brown, transparent liquid was formed. When 0.30 g of isoamyl methyl ketone and 1.80 g of isobutylic acid were added to this liquid and stirred, a transparent paste was formed. When this was coated onto a substrate such as glass and so forth, heated to 350° C. in a reducing atmosphere and baked, a molybdenum film was obtained. Furthermore, in this example, 4.72 moles of amino compounds were used to 1 mole of metal.

Example 33

When 0.70 g (7.94 mmol) of N-methyl-1,3-diaminopropane and 0.40 g (5.33 mmol) of 1-amino-2-propanol were added to 1.00 g (4.31 mmol) of manganese acetate dehydrate ($Mn(OOCCH_3)_2 \cdot 2H_2O$) and stirred, a dark brown, transparent viscous liquid was formed. When 0.30 g of 2,4-dimethyl-3-pentanone and 1.10 g of isobutylic acid were added to this liquid and stirred, a transparent paste was formed. When this was coated onto a substrate such as glass and so forth, heated to 370° C. in a reducing atmosphere and baked, a manganese film was obtained. Furthermore, in this example, 3.08 moles of amino compounds were used to 1 mole of metal.

Example 34

When 0.50 g (5.67 mmol) of N-methyl-1,3-diaminopropane and 0.50 g (6.66 mmol) of 1-amino-2-propanol were added to 1.00 g (4.56 mmol) of zinc acetate dehydrate crystals ($Zn(OOCCH_3)_2 \cdot 2H_2O$) and stirred, a colorless, transparent liquid was formed. When 0.30 g of ethylene glycol dimethyl ether and 1.00 g of 3-cyclohexanepropionic acid ($C_6H_{11}CH_2CH_2COOH$) were added to this liquid and stirred, a transparent paste was formed. When this was coated onto a substrate such as glass and so forth, heated to 300° C. in a reducing atmosphere and baked, a zinc film was obtained. Furthermore, in this example, 2.70 moles of amino compounds were used to 1 mole of metal.

Example 35

When 0.85 g (9.64 mmol) of N-methyl-1,3-diaminopropane and 0.50 g (6.66 mmol) of 1-amino-2-propanol were added to 1.00 g (1.66 mmol) of chromium acetate ($(CH_3COO)_7Cr_3(OH)_2$) and stirred, a green transparent liquid was formed. A purple color was visible when this was looked through an incandescent lamp, and a blackish-gray color was visible when this was looked through a fluorescent lamp. When 0.30 g of 2-heptanone and 1.30 g of isobutylic acid were added and stirred, a transparent paste was formed. When this was coated onto a substrate such as glass and so forth, heated to 340° C. in a reducing atmosphere and baked, a powder-like chromium film was obtained. Furthermore, in this example, 3.27 moles of amino compounds were used to 1 mole of metal.

Example 36

When 0.60 g (6.80 mmol) of N-methyl-1,3-diaminopropane and 0.50 g (6.66 mmol) of 1-amino-2-propanol were added to 1.00 g (5.75 mmol) of iron acetic anhydride ($Fe(OOCCH_3)_2$) and stirred, a brown, transparent viscous liquid was formed. When 0.30 g of diethylene glycol dimethyl ether and 1.10 g of isobutylic acid were added to this liquid and stirred, a transparent paste was formed. When this was coated onto a substrate such as glass and so forth, heated to 350° C. in a reducing atmosphere and baked, an iron film was obtained. Furthermore, in this example, 2.34 moles of amino compounds were used to 1 mole of metal.

The metal paste of the present invention is characterized by blending a medium in the form of an amino compound into an organo- or inorganometallic compound of a metal that is a solid at ordinary temperature and belongs to groups 3 through 15 of the periodic table to form a paste that demonstrates coatable viscosity.

Thus, an organo- or inorganometallic compound can be directly and easily formed into a paste by a simple procedure comprising of adding a general-purpose, inexpensive amino compound to a general-purpose, inexpensive solid organo- or inorganometallic compound and stirring, and without requiring the use of special compounds or synthesis methods. Moreover, the metal paste of the present invention can be baked at low temperatures (within the range of, for example, 90–550° C.) to obtain various types of metal films. Consequently, metal films of various types of metals or alloys can be manufactured continuously and inexpensively with an industrially simple process and apparatus even on various types of generalpurpose, inexpensive substrates having a low softening point.

In addition, since baking can be carried out at low temperatures, the surface of the metal is less susceptible to oxidation than in the case of baking at high temperatures, thereby allowing the obtaining of a metal film with high electrical conductivity.

As Namely, since baking can be carried out at low temperatures using an inexpensive organo- or inorganometallic compound, in addition to being able to hold equipment costs of metal film production to a low level, a metal film can be formed on a general-purpose, inexpensive substrate having a low melting point. For example, although silver-palladium metal film is currently formed at a high temperature of 950° C., in the present invention, a homogenous silver-palladium film can be formed on a glass substrate by baking at approximately 320° C.

What is claimed is:

1. A metal paste being capable of forming a uniform and electrically conductive metal film by low-temperature baking comprising a nitrate salt, cyano compound, carbonyl compound or organic acid salt of a metal that is a solid at ordinary temperature and belongs to group 3 through 15 of the periodic table, and a primary or secondary amino compound as medium, which can make the former change into a liquid or mud to allow the obtaining of a coatable, viscous and homogenous metal paste.

2. The paste according to claim 1, wherein said metal belonging to groups 3 through 15 of the periodic table is Pd, Pt, Rh, Au, Ag, Co, Pb, Cu, In, Sn, Sb, Ru, Cd, Ti, Bi, Cr, Mn, Fe, Ni, Zn or Mo.

3. The paste according to claim 1, wherein said amino compound is an aliphatic or aromatic amine.

4. The paste according to claim 3, wherein said aliphatic or aromatic amine is 1,3-diaminopropane, N-methyl-1,3-diaminopropane, 2,2-dimethyl-1,3-diaminopropane, 1,2-diaminocyclohexane, 1,3-diaminocyclohexane, 1,4-diaminocyclohexane, 1,7-diaminoheptane, 1,12-diaminododecane, 2-methyl-1,5-diaminopentane, 2-methoxyethylamine, 3-methoxypropylamine, 3-propoxypropylamine, 2-amino-1-propanol, N-methylaniline, 1-phenylethylamine, 1,2-phenylenediamine, 1,3-phenylenediamine, 1,4-phenylenediamine or morpholine.

5. The paste according to claim 1, additionally containing an aliphatic or aromatic mono- or dicarboxylic acid or its ester.

6. The paste according to claim 5, wherein said aliphatic or aromatic mono- or dicarboxylic acid or its ester is formic acid, oxalic acid, acetic acid, propionic acid, butylic acid, 2-ethylhexanoic acid, heptanoic acid, nonanoic acid, malic acid, pivalinic acid, cyclohexanoic acid, cyclohexanepropionic acid, hydroxybenzoic acid, phenylacetic acid, methylbenzoate, ethylhydroxybenzoate, ethyl2-ethylhexanoate, ethyl acetate, ethyl hydroxyacetate or methyl linolate.

7. The paste according to claim 1, additionally containing an aliphatic or aromatic mono- or polyhydric alcohol.

8. The paste according to claim 7, wherein said aliphatic or aromatic mono- or polyhydric alcohol is nerol, citronellol, hydroxynerol, hydroxycitronellol, ethyl alcohol, propyl alcohol, butyl alcohol, hexyl alcohol, ethylhexyl alcohol, decyl alcohol, benzyl alcohol, hydroxybenzyl alcohol, phenylethyl alcohol, phenylpropyl alcohol, dihydroxybenzene, cyclohexyl alcohol, ethylcyclohexyl alcohol, butylcyclohexyl alcohol, methoxybenzyl alcohol, piperonyl alcohol, ethylene glycol, propylene glycol, 1,2-butanediol,2,2-dimethyl-1,3-propanediol, ethylene glycol monomethyl ether, diethylene glycol monoethyl ether, triethylene glycol monopropyl ether, propylene glycol monomethyl ether, propylene glycol monoethyl ether, tripropylene glycol monopropyl ether, diethylene glycol, dipropylene glycol, ethylene glycol monobutyl ether and 1-butoxy-2-propanol, lactonitrile, hydroxyacetonitrile, ethylene cyanohydrin or acetone cyanohydrin.

9. The paste according to claim 1, additionally containing an aliphatic or aromatic ketone.

10. The paste according to claim 9, wherein said aliphatic or aromatic ketone is acetone, ethyl methyl ketone, 2-pentanone, 3-pentanone, 3-methyl-2-butanone, 2-hexanone, 3-hexanone, methyl butyl ketone, 3-methyl-2-pentanone, 2-heptanone, 3-heptanone, 4-heptanone, amyl methyl ketone, ethyl butyl ketone, 2,4-dimethyl-3-pentanone, 2-octanone, 3-octanone, 4-octanone, 2,5-dimethyl-3-hexanone, cyclohexanone, methylcyclohexanone, acetophenone, acetylacetone, 2,3-butanedione, 2,3-pentanedione, 3,4-hexanedione, 2,5-hexanedione or cyclohexanedione.

11. The paste according to claim 1, additionally containing an aliphatic or aromatic ether.

12. The paste according to claim 11, wherein said aliphatic or aromatic ether is ethylene glycol dimethyl ether, ethylene glycol diethyl ether, ethylene glycol dipropyl ether, propylene glycol dimethyl ether, propylene glycol diethyl ether, diethylene glycol dimethyl ether, diethylene glycol diethyl ether, dipropylene glycol dimethyl ether, dipropylene glycol diethyl ether, propylene glycol dipropyl ether, 4-methoxy-2-butanone, 4-ethoxy-2-butanone, 4-methoxy-2-butanone, 2-methoxy-2-methyl-4-pentanone, acetal, acetone diethylacetal,2,2-dimethoxypropane, anisole or dimethoxybenzene.

13. The paste according to claim 1, that is used in the fields of electronic materials, mechanical materials, optical materials, sanitary materials, domestic materials, agricultural materials and pharmaceutical materials.

14. A production process of a metal film comprising forming a metal film by coating a metal paste according to claim 1 onto a substrate and baking at 90–550° C.

15. The production process according to claim 14, wherein said substrate is a substrate for an electrically conductive material, resistor material, heat transmitting material, heat insulating material, light and electromagnetic wave reflecting and absorbing materials, corrosion-resistant material, mechanically strong material, material for absorbing abrasion, material for catarysis, metal luster material, material for coloring, material for decoration or microbial growth-inhibiting material, which is made of ceramics, metal, glass, plastic or paper.

* * * * *